US012738463B2

(12) United States Patent
Kim et al.

(10) Patent No.: US 12,738,463 B2
(45) Date of Patent: Sep. 15, 2026

(54) SUBSTRATE TREATMENT APPARATUS AND SUBSTRATE TREATMENT METHOD

(71) Applicant: PSK INC., Hwaseong-si (KR)

(72) Inventors: A Ram Kim, Hwaseong-si (KR); Jong Woo Park, Hwaseong-si (KR)

(73) Assignee: PSK INC., Gyeonggi-Do (KR)

( * ) Notice: Subject to any disclaimer, the term of this patent is extended or adjusted under 35 U.S.C. 154(b) by 69 days.

(21) Appl. No.: 18/724,150

(22) PCT Filed: Nov. 30, 2022

(86) PCT No.: PCT/KR2022/019140
§ 371 (c)(1),
(2) Date: Jun. 25, 2024

(87) PCT Pub. No.: WO2023/128325
PCT Pub. Date: Jul. 6, 2023

(65) Prior Publication Data
US 2026/0018389 A1 Jan. 15, 2026

(30) Foreign Application Priority Data
Dec. 29, 2021 (KR) ........................ 10-2021-0190694

(51) Int. Cl.
*H01J 37/32* (2006.01)

(52) U.S. Cl.
CPC ..... *H01J 37/32651* (2013.01); *H01J 37/3211* (2013.01); *H01J 37/32477* (2013.01); *H01J 2237/332* (2013.01); *H01J 2237/334* (2013.01)

(58) Field of Classification Search
CPC ............. H01J 37/32651; H01J 37/3211; H01J 37/32477; H01J 2237/332; H01J 2237/334
USPC .................... 118/723, 1, 723 IR; 156/345.48
See application file for complete search history.

(56) References Cited

U.S. PATENT DOCUMENTS

| | | | | |
|---|---|---|---|---|
| 5,234,529 | A * | 8/1993 | Johnson | H05H 1/46 204/298.34 |
| 6,814,838 | B2 * | 11/2004 | Weichart | H01J 37/321 204/192.12 |

FOREIGN PATENT DOCUMENTS

| | | | | |
|---|---|---|---|---|
| CN | 112447482 A | 3/2021 | | |
| JP | H10-275694 A | 10/1998 | | |
| JP | 2001523883 A | 11/2001 | | |
| JP | 2002-526891 A | 8/2002 | | |
| JP | 2002343776 A | * 11/2002 | | A47L 13/24 |
| JP | 3907425 B2 | 4/2007 | | |

(Continued)

OTHER PUBLICATIONS

Machine Translation JP 2002-343776 (Year: 2002).*

*Primary Examiner* — Rodney G Mcdonald
(74) *Attorney, Agent, or Firm* — Procopio, Cory, Hargreaves & Savitch LLP

(57) ABSTRACT

The present invention provides an apparatus for treating a substrate. The apparatus for treating a substrate may include: a process treatment unit that provides a treatment space in which the substrate is treated; and a plasma generation unit that is provided above the process treatment unit and generates plasma from a process gas. The plasma generation unit includes: a plasma chamber having an electric discharge space formed therein; a shield unit surrounding the exterior of the plasma chamber; an antenna which surrounds the shield unit from the outside of the shield unit and to which high-frequency power is applied; and a connecting unit electrically connecting the shield unit and the antenna.

18 Claims, 12 Drawing Sheets

(56) References Cited

FOREIGN PATENT DOCUMENTS

| | | | |
|---|---|---|---|
| KR | 10-2020-0043449 | A | 4/2020 |
| TW | 557643 | B | 10/2003 |

* cited by examiner

SUBSTRATE TREATMENT APPARATUS AND SUBSTRATE TREATMENT METHOD

CROSS-REFERENCE TO RELATED APPLICATION

The present application is a national phase entry of International Patent Application No. PCT/KR 2022/019140, filed on Nov. 30, 2022, which claims the benefit of K orean Patent Application No. KR 10-2021-0190694, filed on Dec. 29, 2021, the entire contents of which are incorporated herein by reference.

TECHNICAL FIELD

The present invention relates to an apparatus for treating a substrate, and more particularly to an apparatus for treating a substrate by using plasma.

BACKGROUND ART

Plasma refers to an ionized gas state formed of ions, radicals, electrons, and the like, and is Plasma is an ionized gas state composed of ions, radicals, electrons, and the like. Plasma is generated by very high temperatures, strong electric fields, or RF Electromagnetic Fields. The semiconductor device manufacturing process includes an ashing or etching process that removes a thin film on a substrate by using plasma. The ashing or etching process is performed by ion and radical particles contained in the plasma colliding or reacting with a film on the substrate.

Typically, a plasma source that generates the plasma is equipped with a shield member. The shield member may be positioned between an antenna and a chamber to minimize the direct exposure of the high voltage applied to the antenna to the plasma. However, the shield member is provided to be grounded, so that an inner wall of the chamber is shielded. This reduces the discharge efficiency of the initial plasma generated inside the chamber. Furthermore, the inner wall of the chamber shielded by the shield member is not smoothly etched. As a result, the by-products deposited on the inner wall of the chamber are not etched, and it is difficult to remove the by-products deposited on the inner wall of the chamber. The by-products deposited on the inner wall of the chamber interfere with the uniform formation of plasma inside the chamber, which hinders the uniformity of substrate treatment.

Technical Problem

An object of the present invention is to provide a substrate treatment apparatus capable of efficiently performing plasma treatment on a substrate.

Another object of the present invention is to provide a substrate treatment apparatus capable of improving initial discharge efficiency of a plasma source.

Another object of the present invention is to provide a substrate treatment apparatus capable of efficiently controlling the etching action inside the chamber where the plasma is generated.

Another object of the present invention is to provide a substrate treatment apparatus capable of minimizing deposition of by-products on an inner wall of the chamber where plasma is generated.

The problem to be solved by the present invention is not limited to the above-mentioned problems, and the problems not mentioned will be clearly understood by those skilled in the art from the present specification and the accompanying drawings.

Technical Solution

An exemplary embodiment of the present invention provides an apparatus for treating a substrate, the apparatus including: a process treatment unit for providing a treatment space in which the substrate is treated; and a plasma generation unit provided above the process treatment unit to generate plasma from process gas, in which the plasma generation unit includes: a plasma chamber having a discharge space formed therein; a shield unit surrounding an exterior of the plasma chamber; an antenna which surrounds the shield unit from an outside of the shield unit and to which high frequency power is applied; and a connecting unit for electrically connecting the shield unit and the antenna.

According to the exemplary embodiment, the shield unit may include: first shield member surrounding one side of the plasma chamber along a circumference direction of the plasma chamber; and a second shield member facing the first shield member and surrounding the other side opposite the one side of the plasma chamber, and the first shield member and the second shield member may be combined with each other to surround an outer surface of the plasma chamber.

According to the exemplary embodiment, the first shield member and the second shield member may be electrically isolated from each other.

According to the exemplary embodiment, a power terminal to which high frequency power is applied may be formed at an upper end of the antenna, and a ground terminal that is grounded may be formed at a lower end of the antenna, and the connecting unit may include: a first connecting member that electrically directly connects a first point of the antenna and the first shield member; and a second connecting member that electrically directly connects a second point of the antenna and the second shield member, and a distance from the first point to the power terminal and a distance from the second point to the power terminal may be provided differently.

According to the exemplary embodiment, the first point may be located in an upper region of the antenna, and the second point may be located in a middle region of the antenna.

According to the exemplary embodiment, the connecting unit may be movably provided along a longitudinal direction of the antenna.

According to the exemplary embodiment, the connecting unit may include: a first connecting unit that is in contact with the antenna; and a second connecting unit that extends from the first connecting unit in a direction toward the shield unit and is in contact with the shield unit.

According to the exemplary embodiment, the first connecting unit may be formed to surround an outer surface of the antenna and be movable to slide along the outer surface of the antenna.

According to the exemplary embodiment, the first connecting unit may be in face contact with the antenna, and the second connecting unit may be in point contact with the shield unit.

According to the exemplary embodiment, the first connecting unit may be in face contact with the antenna, and the second connecting unit may be in face contact with the shield unit.

According to the exemplary embodiment, the second connecting unit may be formed to be curved in a direction toward the first connecting unit.

According to the exemplary embodiment, the second connecting unit may be provided with a material having elasticity, and an elastic member may be further provided between one point on the second connecting unit where the second connecting unit and the shield unit are in point contact, and another point on the first connecting unit facing the one point.

According to the exemplary embodiment, a length of the shield unit in an up and down direction may correspond to or be larger than a length of the antenna in the up and down direction.

Another exemplary embodiment of the present invention provides an apparatus for treating a substrate, the apparatus including: a chamber for providing a plasma generation region; an antenna disposed adjacent to the chamber, and including a power terminal to which high frequency power is applied and a ground terminal that is grounded; a shield unit disposed between the chamber and the antenna; and a connecting unit for electrically connecting the shield unit and the antenna.

According to the exemplary embodiment, the antenna may be disposed to surround an exterior of the chamber, and the shield unit may include a first shield member and a second shield member that are disposed to be spaced apart in a direction of surrounding the chamber, and the first shield member and the second shield member may be electrically isolated from each other.

According to the exemplary embodiment, the connecting unit may include: a first connecting member for connecting the first shield member to a first point of the antenna; and a second connecting member for connecting the second shield member to a second point of the antenna, and the first point and the second point may be at different distances from the power terminal.

According to the exemplary embodiment, the connecting unit may be movably provided along a longitudinal direction of the antenna According to the exemplary embodiment, the connecting unit may include: a first connecting unit that is in contact with the antenna; and a second connecting unit that extends from the first connecting unit in a direction toward the shield unit and is in contact with the shield unit.

According to the exemplary embodiment, the first connecting unit may be formed to surround an outer surface of the antenna to be in face contact with the antenna, and be movable to slide along the outer surface of the antenna, and the second connecting unit may be formed to be curved in a direction toward the first connecting unit to be in point contact with the shield unit.

According to the exemplary embodiment, the second connecting unit may be provided with a material having elasticity, and an elastic member may be further provided between one point on the second connecting unit where the second connecting unit and the shield unit are in point contact, and another point on the first connecting unit facing the one point.

Advantageous Effects

According to the exemplary embodiment of the present invention, it is possible to efficiently treat a substrate.

Further, according to the exemplary embodiment of the present invention, it is possible to change the position of the plasma generated at the edge region of the substrate.

Further, according to the exemplary embodiment of the present invention, it is possible to change the size of the region in which the plasma is generated.

Further, according to the exemplary embodiment of the present invention, it is possible to provide additional control factors capable of controlling flow of the plasma.

The effect of the present invention is not limited to the foregoing effects, and the not-mentioned effects will be clearly understood by those skilled in the art from the present specification and the accompanying drawings.

DESCRIPTION OF DRAWINGS

FIG. 14 is a diagram schematically illustrating another exemplary embodiment of the process chamber of FIG. 13.

BEST MODE

Figure 1:
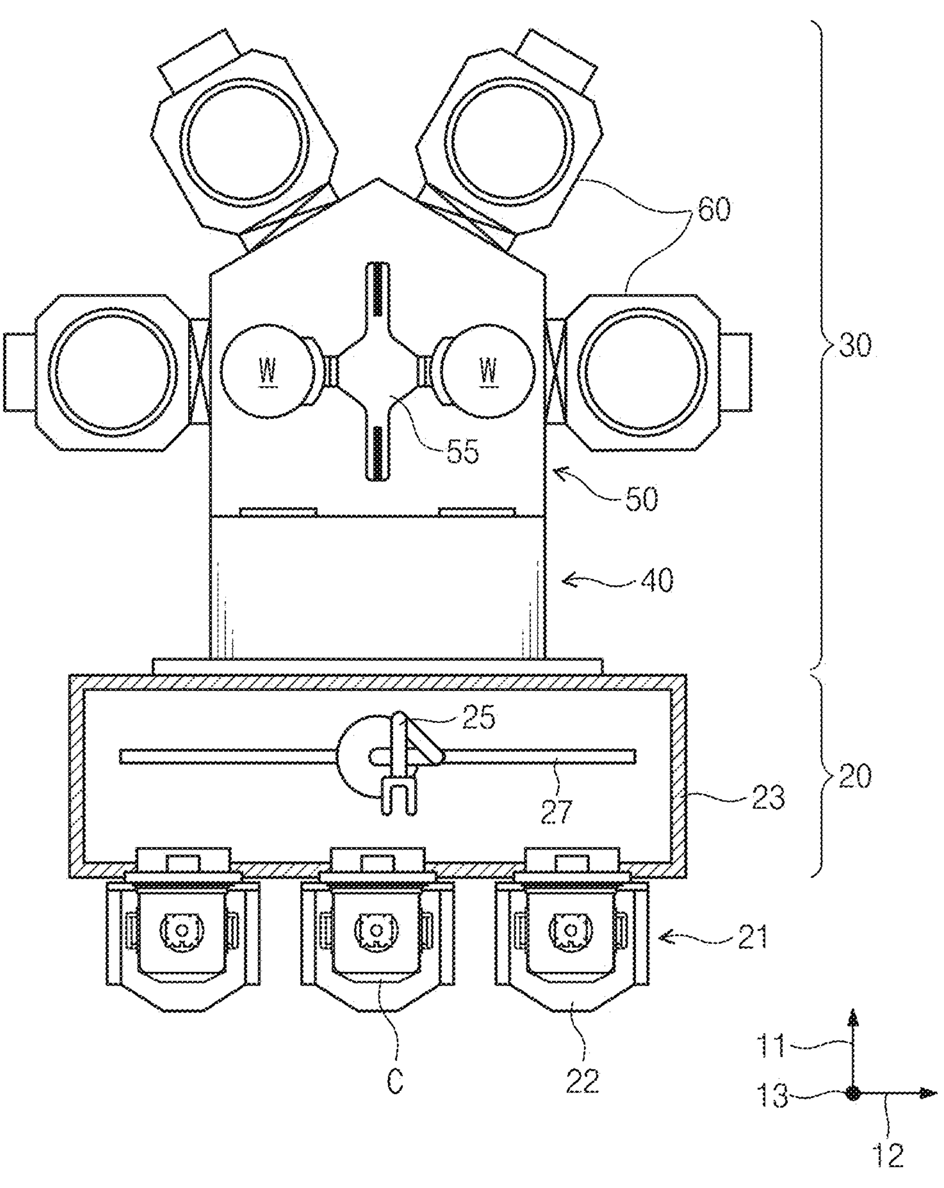
FIG. 1 is a diagram schematically illustrating a substrate treatment apparatus according to an exemplary embodiment of the present invention.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

An exemplary embodiment of the present invention will be described in detail below with reference to FIGS. 1 to 14.

FIG. 1 is a diagram schematically illustrating a substrate treatment apparatus according to an exemplary embodiment of the present invention. Referring to FIG. 1, a substrate treatment apparatus 1 includes an Equipment Front End Module (EFEM) 20 and a treatment module 30. The EFEM 20 and the treatment module 30 are disposed in one direction. Hereinafter, the direction in which the equipment front end module 20 and the treatment module 30 are arranged is defined as a first direction 11. Further, the direction perpendicular to the first direction 11 is defined as a second direction 12, and the direction perpendicular to both the first direction 11 and the second direction 12 is defined as a third direction 13.

The EFEM 20 includes a load port 21 and a transfer frame 23. The load port 21 is disposed at the front of the EFEM 20 in the first direction 11. The load port 21 includes a support part 22. The support parts 22 may be provided in a plurality. Each support part 22 may be arranged in line in the second direction 12. In each support 22, a carrier C (for example, cassette, or FOUP) in which a substrate W to be provided to the process and the process-completed substrate W is stored is seated.

The transfer frame 23 is disposed between the load port 21 and the treatment module 30. The transfer frame 23 may have an inner space. In the inner space of the transfer frame 23, the load port 21 and the first transfer robot 25 may be disposed. The first transfer robot 25 may transfer the substrate W between the load port 21 and the treatment module 30. The first transfer robot 25 may move along a transfer rail 27 provided in the second direction 12 to transfer the substrate W between the carrier C and the treatment module 30.

The treatment module 30 may include a load lock chamber 40, a transfer chamber 50, and a process chamber 60.

The load lock chamber 40 is disposed to be adjacent to the transfer frame 23. For example, the load lock chamber 40 may be disposed between the transfer chamber 50 and the EFEM 20. The load lock chamber 40 provides a waiting space for substrates W to be provided to the process before they are transferred to the process chamber 60, or for substrates W that have completed process treatment before they are transferred to the equipment front end module 20.

The transfer chamber 50 is disposed to be adjacent to the load lock chamber 40. The transfer chamber 50 may have a polygonal body when viewed from above. For example, the transfer chamber 50 may have a pentagonal body when viewed from above. On the exterior side of the body, the load lock chamber 40 and a plurality of process chambers 60 may be disposed along the circumference of the body. In each sidewall of the body, a passage (not illustrated) may be formed through which the substrate W enters and exits. The passage (not illustrated) may connect the transfer chamber 50 to the load lock chamber 40 or the process chamber 60. Each passage (not illustrated) may be provided with a door (not illustrated) that opens and closes the passage (not illustrated) to seal the interior.

In the interior space of the transfer chamber 50, a second transfer robot 55 is disposed to transfer the substrate W between the load lock chamber 40 and the process chambers 60. The second transfer robot 55 may transfer the unprocessed substrate W waiting in the load lock chamber 40 to the process chamber 60. The second transfer robot 55 may transfer the substrate W, which has been completely treatment-processed, to the load lock chamber 40. Further, the second transfer robot 55 may transfer the substrate W between the process chambers 60 in order to sequentially provide the plurality of process chambers 60 with the substrate W.

For example, when the transfer chamber 50 has a pentagonal body, as shown in FIG. 1, the load lock chamber 40 may be disposed on each of the sidewalls adjacent to the EFEM 20, and the process chambers 60 may be disposed consecutively on the remaining sidewalls. However, the present invention is not limited to the foregoing example, and the shape of the transfer chambers 60 is not limited thereto, and may be provided in various modified forms depending on the required process module.

The process chambers 60 are disposed along the circumference of the transfer chamber 50. A plurality of process chambers 60 may be provided. Within each process chamber 60, a process treatment is performed on the substrate W. The process chamber 60 receives the substrate W from the second transfer robot 55, processes the substrate W, and provides the treatment-completed substrate W to the second transfer robot 55.

The process treatment performed in the respective process chambers 60 may be different from each other. The process performed by the process chamber 60 may be one process in the process of producing a semiconductor device or a display panel by using the substrate W. The substrate W processed by the substrate treatment apparatus 1 is an inclusive concept that includes all substrates W used in the manufacturing of semiconductor devices, Flat Panel Displays (FPDs), and other articles with circuit patterns formed on thin films. For example, the substrate W may be a silicon wafer, a glass substrate, or an organic substrate.

Figure 2:
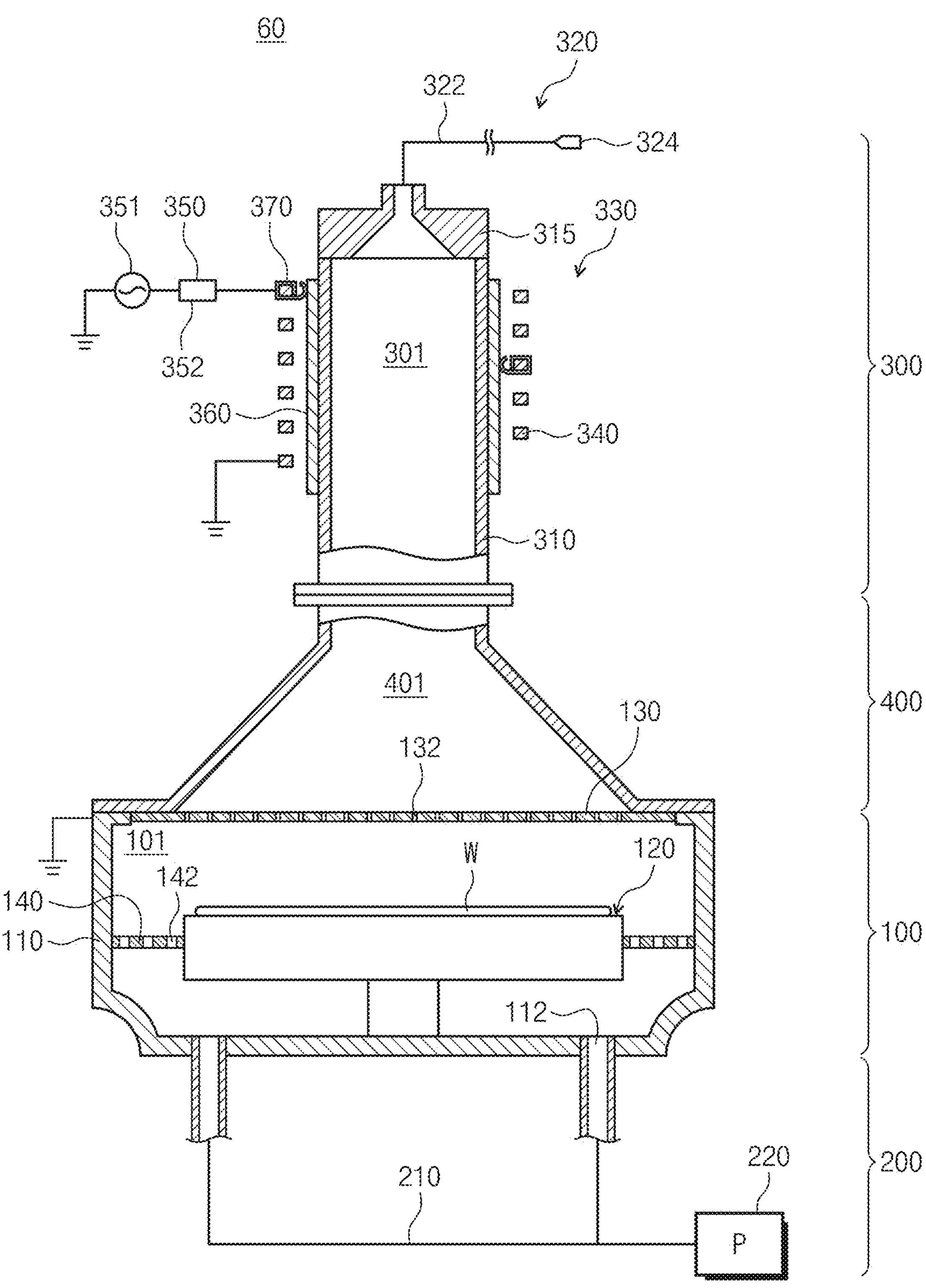
FIG. 2 is a diagram schematically illustrating a process chamber performing a plasma treatment process among process chambers of the substrate treatment apparatus of FIG. 1 according to the exemplary embodiment.

FIG. 2 is a diagram schematically illustrating the process chamber performing a plasma treatment process among the process chambers of the substrate treatment apparatus of FIG. 1 according to the exemplary embodiment. Hereinafter, the present invention will be described based on the case where a process of treating the substrate W by using plasma in the process chamber 60 as an example.

Referring to FIG. 2, the process chamber 60 may perform a predetermined process on the substrate W by using plasma. For example, the process chamber 60 may etch or ash a thin film on the substrate W. The thin film may be various types of films, such as a polysilicon film, an oxide film, or a silicon nitride film. Optionally, the thin film may be a natural oxide film or a chemically generated oxide film.

The process chamber 60 may include a process treatment unit 100, an exhaust unit 200, a plasma generation unit 300, and a diffusion unit 400.

The process treatment unit 100 provides a treatment space 101 where the substrate W is placed and where treatment is performed on the substrate W. Plasma is generated by discharging process gas in the plasma generation unit 300, which will be described later, and the generated plasma is supplied to the treatment space 101 of the process treatment unit 100. Process gas that remains inside the process treatment unit 100 and/or reaction by-products generated from the process of treating the substrate W are discharged to the outside of the process chamber 60 via the exhaust unit 200, which will be described later. Thereby, the internal pressure of the process treatment unit 100 may be maintained at a set pressure.

The process treatment unit 100 may include a housing 110, a support unit 120, a baffle 130, and an exhaust baffle 140.

The housing 110 has a treatment space therein where the substrate W is treated. An outer wall of the housing 110 may be provided as a conductor. In one example, the outer wall of the housing 110 may be provided of a metal material including aluminum. According to the exemplary embodiment, the housing 110 may be grounded. An upper portion of the housing 110 may be open. The open upper portion of the housing 110 may be connected to the diffusion chamber 410, which will be described later. An opening (not illustrated) may be formed in the sidewall of the housing 110. The opening (not illustrated) may be opened and closed by an opening/closing member, such as a door (not illustrated).

The substrate W enters and exits the interior of the housing 110 through the opening (not illustrated) formed in the sidewall of the housing 110.

Additionally, exhaust holes 112 may be formed in the bottom surface of the housing 110. The exhaust holes 112 may exhaust process gas and/or by-products flowing through the treatment space 101 to the exterior of the treatment space 101. The exhaust hole 112 may be connected with the configurations included in the exhaust unit 200 described later.

The support unit 120 is located inside the treatment space 101. The support unit 120 supports the substrate W in the treatment space 101. The support unit 120 may include a support plate 122 and a support shaft 124.

The support plate 122 may hold and/or support an object. The support plate 122 may hold and/or support the substrate W. The support plate 122 may be provided in a substantially disk-like shape when viewed from above. The support plate 122 is supported by the support shaft 124. The support plate 122 may be connected to an external power source (not illustrated). The support plate 122 may generate static electricity by power applied from the external power source (not illustrated). The electrostatic force of the generated static electricity may hold the substrate W to the top surface of the support plate 122. However, the present invention is not limited thereto, and the support plate 122 may hold and/or support the substrate W in a physical manner, such as a mechanical clamp, or in a vacuum adsorption manner.

The support shaft 124 may move a target object. The support axis 124 may move the substrate W in an upward or downward direction. For example, the support shaft 124 may be coupled to the support plate 122 and may raise and lower the support plate 122 to move the substrate W seated on the top surface of the support plate 122 in the up and down direction.

The baffle 130 may uniformly deliver plasma generated in the plasma generation unit 300, which will be described later, to the treatment space 101. The baffle 130 may uniformly distribute the plasma generated in the plasma generation unit 300 and flowing inside the diffusion unit 400 to the treatment space 101.

The baffle 130 may be disposed between the process treatment unit 100 and the plasma generation unit 300. The baffle 130 may be disposed between the support unit 120 and the diffusion unit 400. For example, the baffle 130 may be disposed on top of the support plate 122.

The baffle 130 may have a plate shape. The baffle 130 may have a substantially disk shape when viewed from above. The baffle 130 may be disposed to overlap the top surface of the support plate 122 when viewed from above.

The baffle 130 is formed with baffle holes 132. The baffle holes 132 may be provided in a plurality. The baffle holes 12 may be spaced apart from each other. For example, the baffle holes 132 may be formed on a concentric circumference of the baffle 130 at regular intervals to provide a uniform supply of plasma (or radicals). The plurality of baffle holes 132 may penetrate from above end to the bottom end of the baffle 130. The plurality of baffle holes 132 may function as passages for the plasma generated in a plasma generation unit 330 to flow into the treatment space 101.

The surface of the baffle 130 may be provided with an oxidized aluminum material. The baffle 130 may be electrically connected to an upper wall of the housing 110. Optionally, the baffle 130 may be independently grounded. By grounding the baffle 130, ions contained in the plasma passing through the baffle holes 132 may be captured. For example, charged particles, such as electrons or ions included in the plasma, may be trapped in the baffle 130, and uncharged neutral particles, such as radicals included in the plasma, may pass through the baffle holes 132 and be supplied into the treatment space 101.

The present invention has been described based on the case where the baffle 130 according to the exemplary embodiment of the present invention is provided in the form of a disk having a thickness as an example, but the present invention is not limited thereto. For example, the baffle 130 may have a generally circular shape when viewed from above, but may have a shape in which the height of the top surface increases from the edge region to the center region when viewed in cross-section. In one example, the baffle 130 may have a shape such that its top surface slopes upwardly from the edge region to the center region when viewed in cross-section. Accordingly, plasma generated from the plasma generation unit 330 may flow along the sloping cross-section of the baffle 130 to the edge region of the treatment space 101.

The exhaust baffles 140 uniformly exhaust the plasma flowing through the treatment space 101 for each region. Additionally, the exhaust baffle 140 may adjust the residence time of the plasma flowing within the treatment space 101. When viewed from above, the exhaust baffle 140 has an annular ring shape. The exhaust baffle 140 may be positioned between the inner wall of the housing 110 and the support unit 120 within the treatment space 101.

A plurality of exhaust holes 142 is formed in the exhaust baffle 140. The plurality of exhaust holes 142 are provided as through holes that penetrate the top surface and the bottom surface of the exhaust baffle 140. The exhaust holes 142 may be provided to face in an upward or downward direction. The exhaust holes 142 are arranged to be spaced apart from each other along the circumferential direction of the exhaust baffle 140. Reaction by-products that pass through the exhaust baffle 140 are discharged to the outside of the process chamber 60 through the exhaust hole 112 formed in the bottom surface of the housing 110 and through the exhaust line 210 described later.

The exhaust unit 200 exhausts impurities, such as process gas and/or process by-products, from the treatment space 101 to the outside. The exhaust unit 200 may exhaust impurities, particles, and the like generated during the process of treatment the substrate W to the outside of the process chamber 60. The exhaust unit 200 may include an exhaust line 210 and a pressure reducing member 220.

The exhaust line 210 functions as a passage for reaction by-products residing in the treatment space 101 to be discharged to the outside of the process chamber 60. One end of the exhaust line 210 communicates with the exhaust holes 112 formed in the bottom surface of the housing 110. The other end of the exhaust line 210 is connected with the pressure reducing member 220 that provides negative pressure.

The pressure reducing member 220 provides negative pressure to the treatment space 101. The pressure reducing member 220 may discharge process by-products, process gas, or plasma that remains in the treatment space 101 to the outside of the housing 110. Additionally, the pressure reducing member 220 may regulate the pressure in the treatment space 101 such that the pressure in the treatment space 101 is maintained at a preset pressure. The pressure reducing member 220 may be provided by a pump. However, the pressure reducing member 220 is not limited thereto, and may be provided with various variations of known devices that provide negative pressure.

The plasma generation unit 300 may be located above the process treatment unit 100. Additionally, the plasma generation unit 300 may be located on top of the diffusion unit 400, which will be described later. The process treatment unit 100, the diffusion unit 400, and the plasma generation unit 300 may be sequentially disposed from the ground along the third direction 13. The plasma generation unit 300 may be separated from the housing 110 and the diffusion unit 400. A sealing member (not illustrated) may be provided at the location where the plasma generation unit 300 and the diffusion unit 400 are coupled.

The plasma generation unit 300 may include a plasma chamber 310, a gas supply unit 320, and the plasma generation unit 330.

The plasma chamber 310 has a discharge space 301 inside. The discharge space 301 functions as a space to excite process gas supplied from the gas supply unit 320, described later, to form plasma. The plasma chamber 310 may have a shape with open top and bottom surfaces. In one example, the plasma chamber 310 may have a cylindrical shape with open top and bottom surfaces. The plasma chamber 310 may be provided with a material including ceramic material or aluminum oxide ($Al_2O_3$). The upper end of the plasma chamber 310 is sealed by a gas supply port 315. The gas supply port 315 is connected to a gas supply pipe 322, which will be described later. The bottom end of the plasma chamber 310 may be connected to the top end of the diffusion chamber 410, described later.

The gas supply unit 320 supplies process gas to the gas supply port 315. The gas supply unit 320 supplies process gas to the discharge space 301 through the gas supply port 315. The process gas supplied to the discharge space 301 may be uniformly distributed to the treatment space 101 via the diffusion space 401 and the baffle holes 132 described later.

The gas supply unit 320 may include the gas supply pipe 322 and a gas supply source 324. One end of the gas supply pipe 322 is connected to the gas supply port 315, and the other end of the gas supply pipe 322 is connected to the gas supply source 324. The gas supply source 324 functions as a source for storing and/or supplying process gas. The process gas stored and/or supplied by the gas supply source 324 may be gas for plasma generation. In one example, the process gas may include difluoromethane ($CH_2F_2$), nitrogen ($N_2$), and oxygen ($O_2$). Optionally, the process gas may further include tetrafluoromethane ($CF_4$), fluorine, and/or hydrogen.

Figure 3:
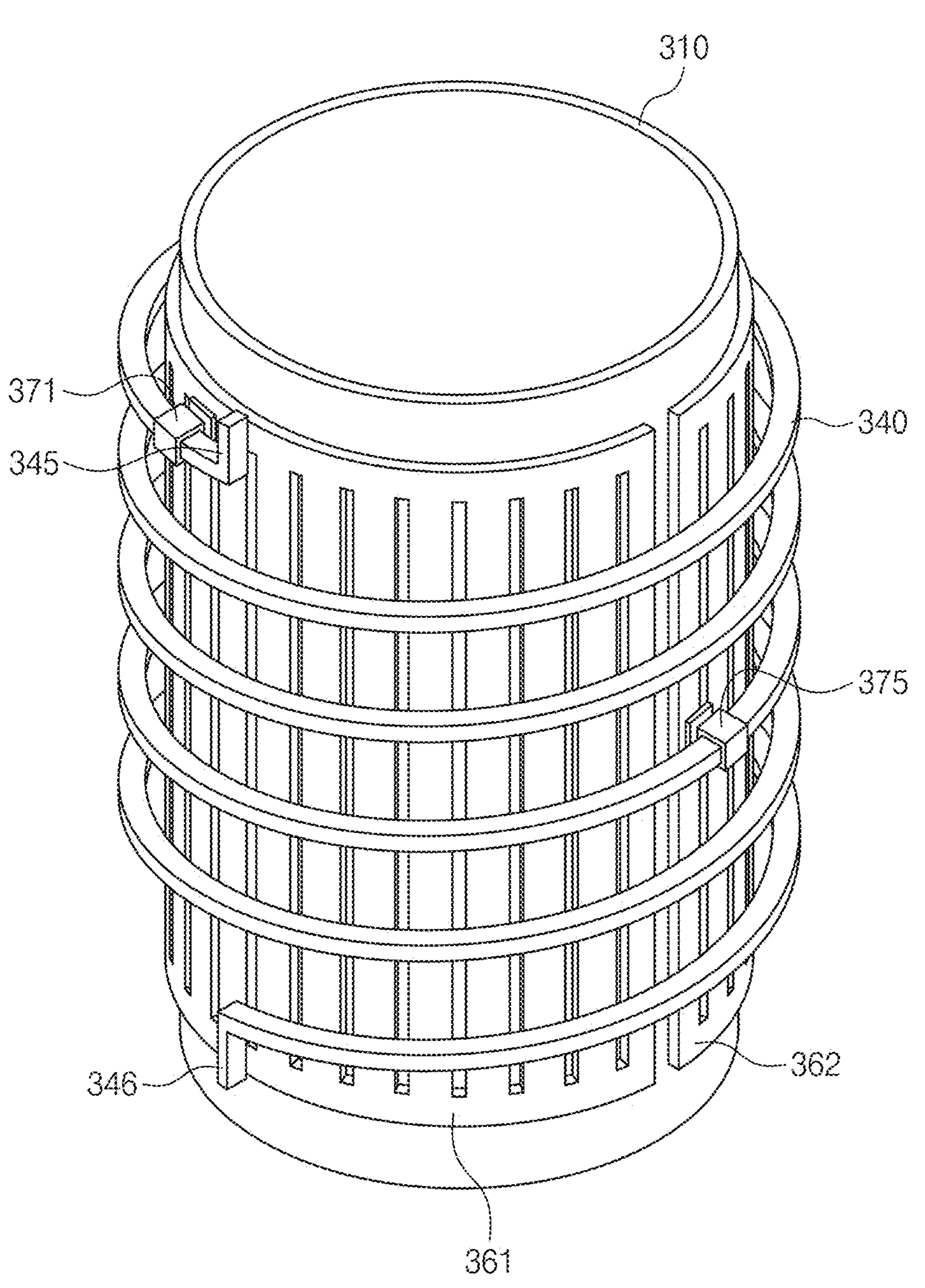
FIG. 3 is a perspective view schematically illustrating a plasma generation unit according to the exemplary embodiment of FIG. 2.
Figure 4:
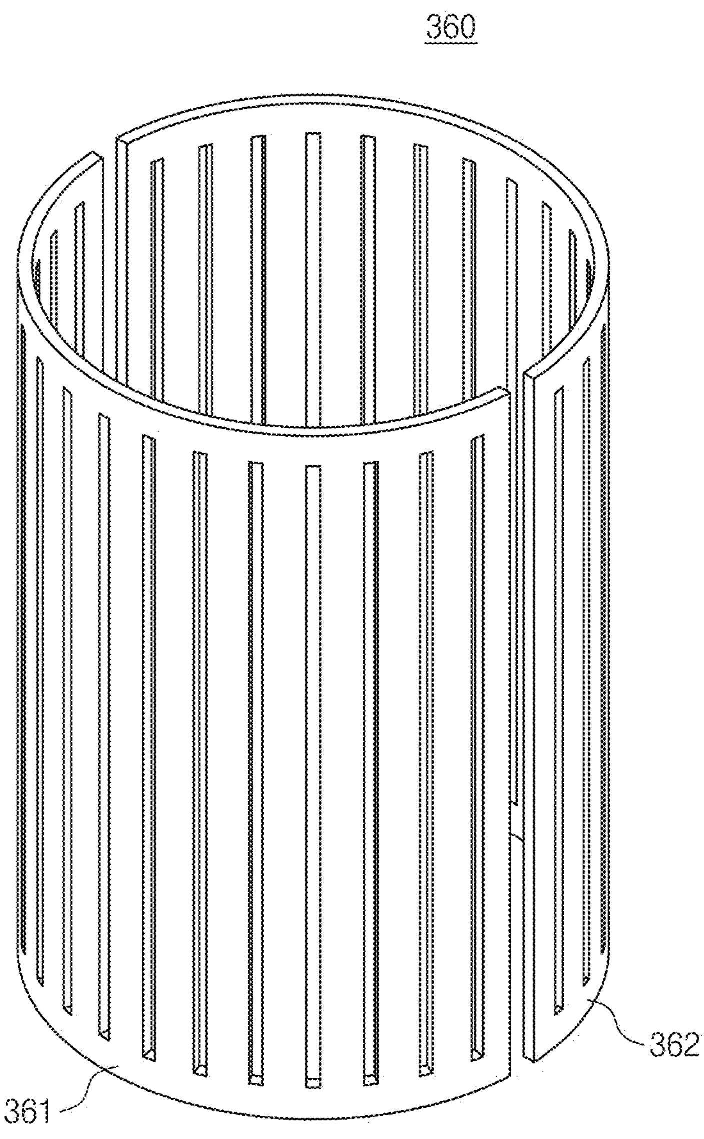
FIG. 4 is a perspective view schematically illustrating a shield unit according to the exemplary embodiment of FIG. 2.
Figure 5:
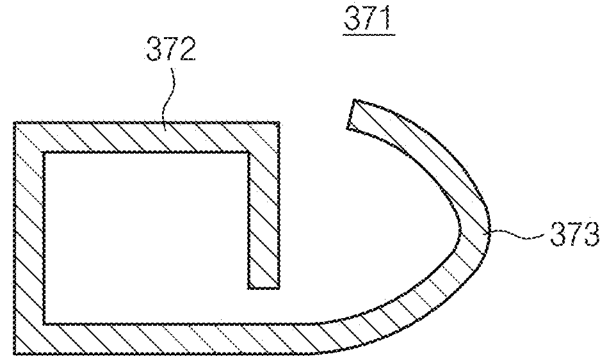
FIG. 5 is a diagram schematically illustrating a first connecting member according to the exemplary embodiment of FIG. 2.
Figure 6:
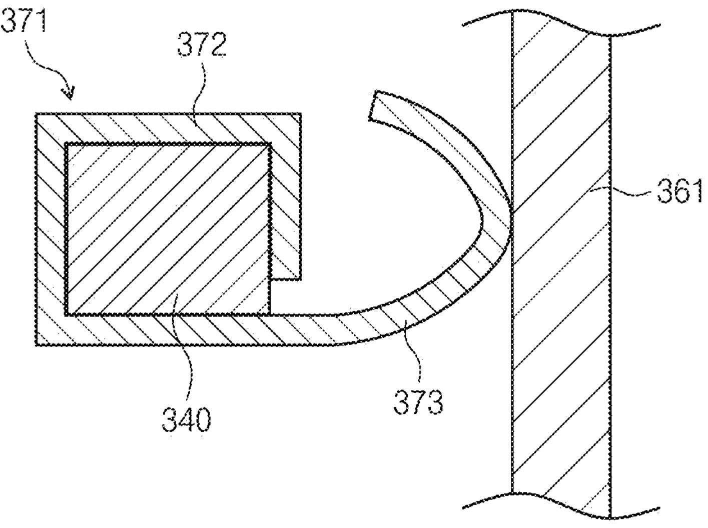
FIG. 6 is a diagram schematically illustrating the first connecting member and a first shield member of FIG. 2 in contact with each other.

FIG. 3 is a perspective view schematically illustrating the plasma generation unit according to the exemplary embodiment of FIG. 2. FIG. 4 is a perspective view schematically illustrating the shield unit according to the exemplary embodiment of FIG. 2. FIG. 5 is a diagram schematically illustrating a first connecting member according to the exemplary embodiment of FIG. 2. FIG. 6 is a diagram schematically illustrating the first connecting member and a first shield member of FIG. 2 in contact with each other. Hereinafter, the plasma generation unit according to the exemplary embodiment of the present invention will be described in detail with reference to FIGS. 2 to 6. The plasma generation unit 330 excites the process gas supplied from the gas supply unit 320 to generate plasma in the discharge space 301. The plasma generation unit 330 applies high frequency power to the antenna 340, which is described later, to excite the process gas supplied to the discharge space 301. The plasma generation unit 330 may include the antenna 340, a power module 350, a shield unit 360, and a connecting unit 370. The antenna 340 and the power module 350 may function as plasma sources to generate plasma in the discharge space 301.

The antenna 340 may be an Inductively Coupled Plasma (ICP) antenna. The antenna 340 may include a coil surrounding the shield unit 360 described later a plurality of turns, outside of the plasma chamber 310. The coil may surround an outer surface of the shield unit 360. The coil may surround the exterior of the plasma chamber 310 in a spiral shape a plurality of times. The coil may be wound on the shield unit 360 in an area corresponding to the discharge space 301. For example, the coil may have a length in an up and down direction corresponding to a top end to a bottom end of the shield unit 360. For example, one end of the coil may be provided at a height corresponding to a top region of the shield unit 360 when viewed from an apical view of the plasma chamber 310. Additionally, the other end of the coil may be provided at a height corresponding to a lower region of the shield unit 360 when viewed from the apical view of the plasma chamber 310.

A power terminal 345 and a ground terminal 346 may be formed on the antenna 340. The power terminal 345 may be connected to a power source 351, which will be described later. High frequency power supplied from the power source 351 may be applied to the antenna 340 via the power terminal 345. The ground terminal 346 may ground the antenna 340.

In one example, the power terminal 345 may be formed on a top end of the antenna 340. Further, the ground terminal 346 may be formed at a lower end of the antenna 340. However, the present invention is not limited thereto, and the power terminal 345 and the ground terminal 346 may be formed at various locations on the antenna 340. For example, the power terminal 345 formed on the antenna 340 may be formed at a midpoint of the antenna 340, and the ground terminal 346 formed on the antenna 340 may be formed at both ends of the antenna 340.

In the examples described above, for ease of illustration, the present invention has been described based on the case where a single coil provided in the antenna 340 surrounds the exterior of the plasma chamber 310, and the power terminal 345 and the ground terminal 346 are formed on the antenna 340 as an example, but the present invention is not limited thereto.

For example, the antenna 340 according to the exemplary embodiment of the present invention may be provided with a plurality of coils. Each of the plurality of coils may be provided to surround the exterior of the plasma chamber 310 in a spiral shape. For example, the plurality of coils may each independently surround a top side and a bottom side of the plasma chamber 310. Further, the plurality of coils may each be independently formed with the power terminal 345 and the ground terminal 346. The magnitude of the high frequency power applied to each of the plurality of coils may be different. Accordingly, different sizes of plasma generated in the plasma chamber 310 may be provided.

The power module 350 may include a power source 351, a power switch (not illustrated), and a matcher 352. The power source 351 applies power to the antenna 340. The power source 351 may apply high frequency power to the antenna 340. Power may be applied to the antenna 340 according to on/off of the power switch (not illustrated). The high frequency power applied to the antenna 340 generates a high frequency current. The high frequency current applied to the antenna 340 may form an induced electric field in the discharge space 301. The process gas supplied to the discharge space 301 may be excited to a plasma state by obtaining the energy required for ionization from the induced electric field.

The matcher 352 may perform matching on high frequency power applied to the antenna 340 from the power source 352. The matcher 352 may be connected to an output terminal of the power source 351 to match output impedance and input impedance of the power source 352.

The present invention has been described based on the case where the power module 350 according to the exemplary embodiment of the present invention includes the power source 351, the power switch (not illustrated), and the matcher 352 as an example, but the present invention is not limited thereto. The power module 350 according to the exemplary embodiment of the present invention may further include a capacitor (not illustrated). The capacitor may be a variable element. The capacitor may be provided as a variable capacitor with a changing capacity. Optionally, the capacitor (not illustrated) may be provided as a fixed capacitor with a fixed capacity.

The shield unit 360 may be provided as a Feraday shield. The shield unit 360 is disposed between the plasma chamber 310 and the antenna 340. The shield unit 360 may surround the exterior of the plasma chamber 310. The shield unit 360 may surround an outer wall of the plasma chamber 310. The shield unit 360 may be provided in a substantially cylindrical shape. Additionally, the shield unit 360 may have a ring shape when viewed from above. The length of the shield unit 360 in the up and down direction may correspond to the length of the antenna 340 in the up and down direction. Optionally, the length in the up and down direction of the shield unit 360 may be provided to be greater than the length in the up and down direction of the antenna 340. The shield unit 360 may have slots formed in the up and down direction. The slots formed in the shield unit 360 may be provided in a plurality, and the plurality of slots may be spaced apart along a circumference direction of the shield unit 360.

The shield unit 360 may be provided from a material including metal. A plurality of shield units 360 may be provided. In one example, as shown in FIGS. 3 and 4, the shield unit 360 may include a first shield member 361 and a second shield member 362. The first shield member 361 and the second shield member 362 may be electrically isolated from each other. The first shield member 361 may surround one side of the plasma chamber 310 along a circumference direction of the plasma chamber 310. For example, the first shield member 361 may surround an outer wall of the plasma chamber 310 corresponding to the left side of a virtual straight line passing through the center of the plasma chamber 310 when viewed from above.

Further, the second shield member 362 may be disposed opposite the first shield member 361. For example, as shown in FIG. 4, the second shield member 362 may surround a side of the plasma chamber 310 that is opposite a side of the plasma chamber 310 that is surrounded by the first shield member 361. The second shield member 362 may surround an outer wall of the plasma chamber 310 corresponding to the right side of the virtual straight line passing through the center of the plasma chamber 310 when viewed from above. The first shield member 361 and the second shield member 362 may be combined with each other to surround the outer wall of the plasma chamber 310.

The connecting unit 370 electrically connects the antenna 340 and the shield unit 360. The connecting unit 370 may be in physical contact with the antenna 340. Additionally, the connecting unit 37 may be in physical contact with the shield unit 360. The connecting unit 370 may be provided of a material including metal. For example, the connecting unit 370 may be provided from a material including copper, silver, aluminum, tungsten, or silver that is highly electrically conductive. Optionally, the connecting unit 370 may be provided with a surface coated with a highly electrically conductive material. The connecting units 370 may be provided in plurality. The connecting unit 370 according to the exemplary embodiment of the present invention may include a first connecting member 371 and a second connecting member 375.

The first connecting member 371 may electrically connect a first point of the antenna 340 and the first shield member 361. The first point may be located in a top region of the antenna 340. For example, the first point may be adjacent to a point where the power terminal 345 is formed.

The second connecting member 375 may electrically connect a second point of the antenna 340 and the second shield member 362. The second point may be located in an intermediate region of the antenna 340. For example, the second point may be located at a midpoint of the antenna 340 where the power terminal 345 is formed. In one example, the second point may be located midway between one point of the antenna 340 where the power terminal 345 is formed and another point of the antenna 340 where the ground terminal 346 is formed.

Accordingly, a distance from the power terminal 345 to the first point and a distance from the power terminal 345 to the second point may be provided differently. The distance from the power terminal 345 to the first point may be provided to be less than the distance from the power terminal 345 to the second point. In one example, the distance from the power terminal 345 to the first point may converge to zero, and the distance from the power terminal 345 to the second point may converge to a half (L/2) of the total length L of the coil provided in the antenna 340.

The first connecting member 371 and the second connecting member 375 may be provided with a similar structure to each other. Therefore, to avoid duplication of content, the following description will focus on the first connecting member 371.

As shown in FIG. 5, the first connecting member 371 may comprise a first connecting unit 372 and a second connecting unit 373. The first connecting unit 372 may be provided as a portion that is in contact with the antenna 340. The first connecting unit 372 may be in contact with the coil provided on the antenna 340. The first connecting unit 372 may be formed in a shape that surrounds an outer surface of the antenna 340. As shown in FIG. 6, the first connecting unit 372 may be in face-to-face contact with the antenna 340. Accordingly, the first connecting unit 372 may be electrically coupled to the antenna 340. The first connecting unit 372 may be movable to slide along the outer surface of the antenna 340. By slidingly moving along the outer surface of the antenna 340, the first connecting unit 372 may be moved along the longitudinal direction of the antenna 340.

In one example, when the shape of the coil provided in the antenna 340 has a square cross-section, the first connecting unit 372 may be provided in a square shape. However, the present invention is not limited thereto, and when the shape of the coil provided in the antenna 340 has a circular cross-section, the first connecting unit 372 may be provided in a circular shape.

The second connecting unit 373 extends from the first connecting unit 372. The second connecting unit 373 may extend from the first connecting unit 372, but may be curved in a direction toward the first connecting unit 372. As shown in FIG. 6, by forming the second connecting unit 373 to be curved, the second connecting unit 373 may be in point contact with the first shield member 361. Thus, the second connecting unit 373 may be electrically connected to the first shield member 361. The second connecting unit 373 may be provided of a material having elasticity. For example, the second connecting unit 373 may be provided of a material that has relatively large elastic force compared to the first connecting unit 372. Accordingly, the second connecting unit 373 may more efficiently make the antenna 340 and the shield unit 360 be in contact with each other.

Hereinafter, the mechanism for the change in intensity of the plasma that is generated in the discharge space 301 inside the plasma chamber 310 depending on the point at which the connecting unit 370 is connected to the shield unit 360 will be described in detail. For ease of description, one region of the discharge space 301 inside the plasma chamber 310 corresponding to the region where the first shield member 361 is installed is defined herein as region A, and one region of the discharge space 301 inside the plasma chamber 310 corresponding to the region where the second shield member 362 is installed is defined herein as region B.

Figure 7:
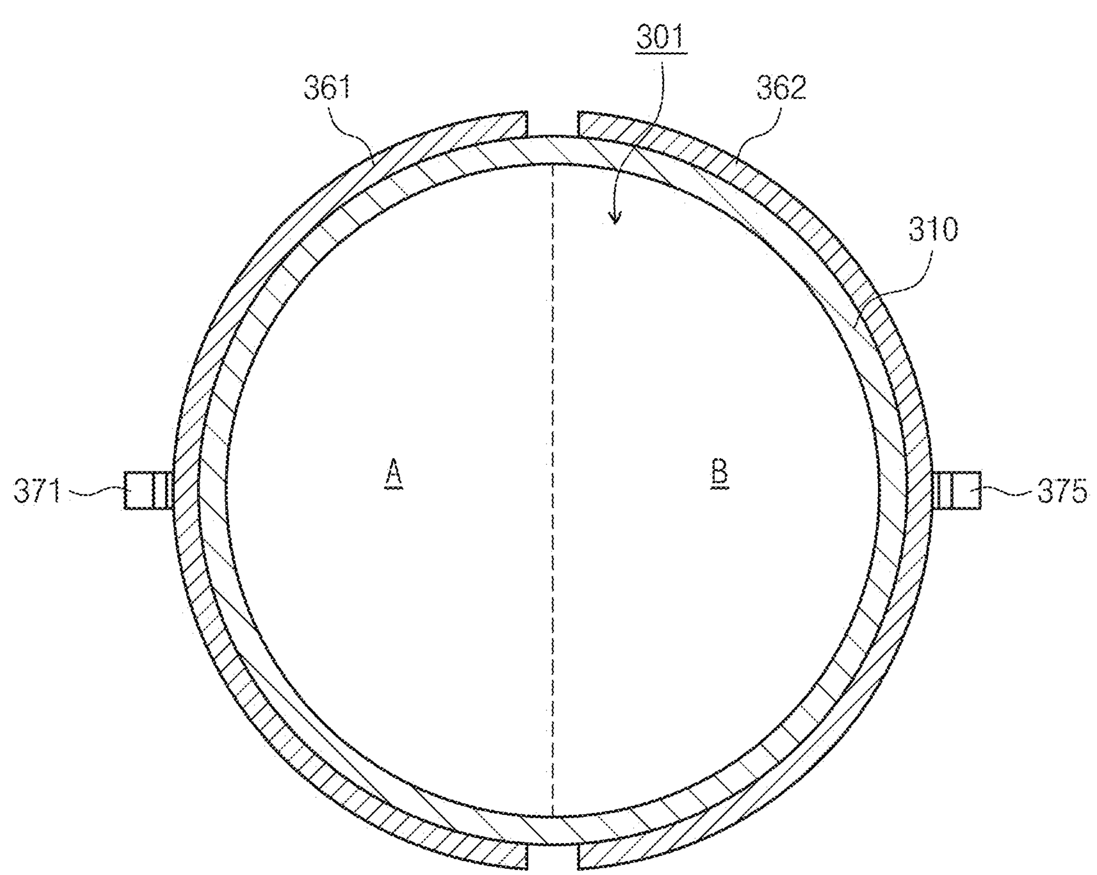
FIG. 7 is a diagram schematically illustrating the plasma chamber of FIG. 2 viewed from above.

FIG. 7 is a diagram schematically illustrating the plasma chamber of FIG. 2 viewed from above. Referring to FIG. 7, the first shield member 361 and the antenna 340 may be electrically connected by the first connecting member 371 provided at a location adjacent to the power terminal 345. A first high frequency voltage V1 may be applied to the first shield member 361 electrically connected by the first connecting member 371. Further, the second shield member 362 and the antenna 340 may be electrically connected by the second connecting member 375 provided at a midpoint between the power terminal 345 and the ground terminal 346. A second high frequency voltage V2 may be applied to the second shield member 362 electrically connected by the second connecting member 375.

The first high frequency voltage V1 applied to the first shield member 361 is greater than the second high frequency voltage V2 applied to the second shield member 362. For example, the first high frequency voltage V1 may have a magnitude corresponding to the high frequency voltage applied to the power terminal 345. As the high-frequency voltage applied to the power terminal 345 flows along the longitudinal direction of the antenna 340 toward the ground terminal 346, a loss of voltage occurs. Since the second connecting member 375 is located at the midpoint between the power terminal 345 and the ground terminal 346, the second high frequency voltage V2 may have approximately half the magnitude of the high frequency voltage applied from the power terminal 345. That is, the second high frequency voltage V2 may have half the magnitude of the first high frequency voltage V1.

The first high frequency voltage V1 applied to the first shield member 361 may generate first plasma having a first magnitude in region A of the discharge space 301. Further, the second high frequency voltage V2 applied to the second shield member 362 may generate second plasma having a second magnitude in region B of the discharge space 301. Thus, the intensity of the plasma generated in region A may be formed to be greater than the magnitude of the plasma generated in region B.

Further, the connecting unit 370 according to the exemplary embodiment of the present invention may be provided to be slidingly movable along the longitudinal direction of the antenna 340. For example, when it is desired to reduce the magnitude of the voltage applied to the first shield member 361, the first connecting member 371 may be moved in a direction away from the power terminal 345. Also, when it is desired to increase the magnitude of the voltage applied to the second shield member 362, the second connecting member 375 may be moved in a direction closer to the power terminal 345. Thus, the magnitude of the voltage applied to the shield unit 360 may be adjusted by varying the position at which the connecting unit 370 is provided, thereby appropriately varying the intensity of the electric field delivered to the discharge space 301.

Generally, when the plasma generating member is provided with the shield member, the shield member may shield the interior of the chamber in which the plasma is generated. However, the shield member may reduce the intensity of the electric field applied to the interior space of the chamber during the initial stage of plasma generation, thereby reducing the discharge efficiency of the initial plasma.

Accordingly, according to the exemplary embodiment of the invention described above, the plurality of shield units 360 may be provided, and each of the shield units 360 may be in independent contact and electrically connected with and the antenna 340 by using the plurality of connecting units 370. Accordingly, the discharge space 301 inside the plasma chamber 310 may be separated and the intensity of the electric field applied to each discharge space 301 may be adjusted. Further, by applying high frequency power to the shield unit 360 that is applied to the antenna 340, the discharge efficiency of the initial plasma generated inside the discharge space 301 may be improved. Furthermore, the voltage of the sheath inside the discharge space 301 may be regulated after the plasma is generated in the discharge space 301 by the shield unit 360, where different magnitudes of high frequency voltage are applied. Accordingly, the magnitude of ion energy applied to the discharge space 301 may be appropriately controlled. As a result, the etching action occurring on the inner surface of the plasma chamber 310 and the deposition of reaction by-products on the inner surface of the plasma chamber 310 may be minimized.

In the exemplary embodiment of the present invention described above, the present invention has been described based on the case where the shield unit 360 includes the first shield member 361 and the second shield member 362 as an example, but the present invention is not limited thereto. For example, the shield unit 360 may be provided with three or more shield members provided with natural number to surround the outer surface of the plasma chamber 310. Furthermore, the present invention has been described based on the case where the shield unit 360 is provided in a plurality as an example, but the shield unit 360 may also be provided in a singular number and be provided to surround the outer surface of the plasma chamber 310.

Referring again to FIG. 2, the diffusion unit 400 may diffuse the plasma generated in the plasma generation unit 300 into the treatment space 101. The diffusion unit 400 may include the diffusion chamber 410. The diffusion chamber 410 has a diffusion space 401 inside. The diffusion space 401 may diffuse the plasma generated in the discharge space 301. The diffusion space 401 connects the treatment space 101 and the discharge space 301 and functions as a passage to flow the plasma generated in the discharge space 301 into the treatment space 101.

The diffusion chamber 410 may be provided in a generally inverted funnel shape. The diffusion chamber 410 may have a shape that increases in diameter from above to the bottom. The inner circumferential surface of the diffusion chamber 410 may be formed of a non-conductor. For example, the inner circumferential surface of the diffusion chamber 410 may be provided with a material including quartz.

The diffusion chamber 410 is positioned between the housing 110 and the plasma chamber 310. The upper end of the diffusion chamber 410 may be connected to the lower end of the plasma chamber 310. The sealing member (not illustrated) may be provided between the top end of the diffusion chamber 410 and the bottom end of the plasma chamber 310.

A shield unit and a connecting unit according to an exemplary embodiment of the present invention described below are provided substantially similar to the shield unit and connecting unit described with reference to FIGS. 2 to 7, except as further described. Accordingly, the description of the overlapping contents will be omitted hereinafter.

Figure 8:
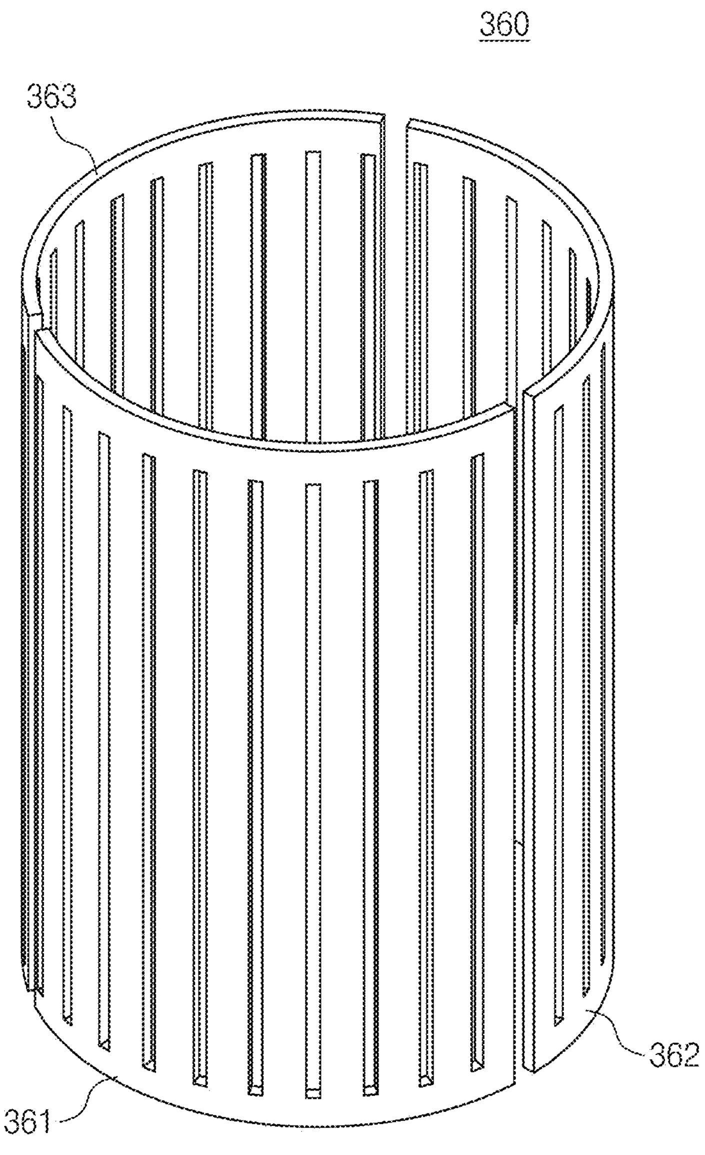
FIGS. 8 and 9 are perspective views illustrating another exemplary embodiment of the shield unit of FIG. 2.
Figure 9:
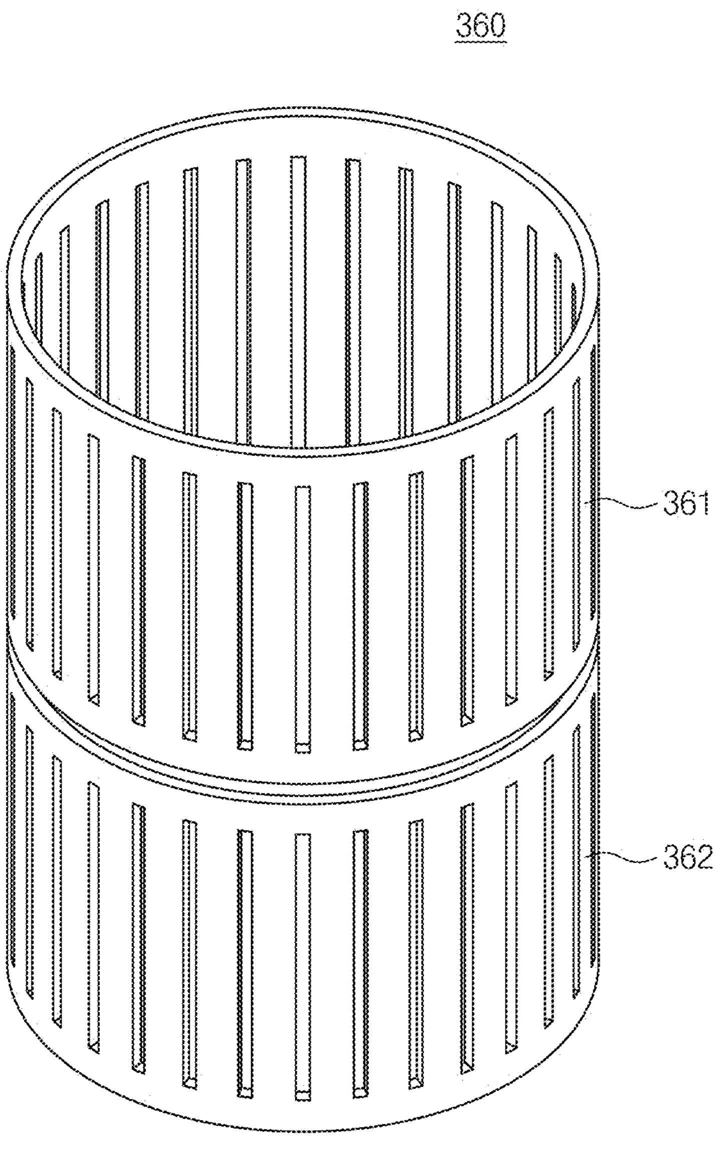

FIGS. 8 and 9 are perspective views illustrating another exemplary embodiment of the shield unit of FIG. 2. Referring to FIG. 8, the shield unit 360 may surround an outer surface of the plasma chamber 310. A plurality of shield units 360 may be provided. For example, the shield unit 360 may be divided into three sections along a circumference direction of the plasma chamber 310. The shield unit 360 may include a first shield member 361, a second shield member 362, and a third shield member 363. The first shield member 361, the second shield member 362, and the third shield member 363 may be electrically isolated from each other. Although not illustrated, the first shield member 361 may be electrically connected with a first connecting member 371, the second shield member 362 may be electrically connected with a second connecting member 375, and the second shield member 363 may be electrically connected with a third connecting member 376. When the shield unit 360 is divided into three sections as shown in FIG. 8, the initial discharge efficiency of the plasma in the discharge space 301 may be further improved. Furthermore, the etching action and the deposition action within the discharge space 301 may be more precisely controlled.

Referring to FIG. 9, a plurality of shield units 360 may be provided. For example, the shield unit 360 may be divided into two sections in an up and down direction of the plasma chamber 310. The shield unit 360 may include a first shield member 361 and a second shield member 362. The first shield member 361 may surround an outer surface of the plasma chamber 310 in a region corresponding to a top region of the plasma chamber 310. The second shield member 362 may surround an outer surface of the plasma chamber 310 in a region corresponding to a lower region of the plasma chamber 310. The first shield member 361 and the second shield member 362 may be electrically isolated from each other. Additionally, a first connecting member 371 may be electrically connected to the first shield member 361 and a second connecting member 375 may be electrically connected to the second shield member 362. As shown in FIG. 9, when the shield unit 360 is divided in an up and down direction, the initial discharge efficiency and the etching and deposition action in the upper region and the lower region of the discharge space 301 may be controlled.

Figure 10:
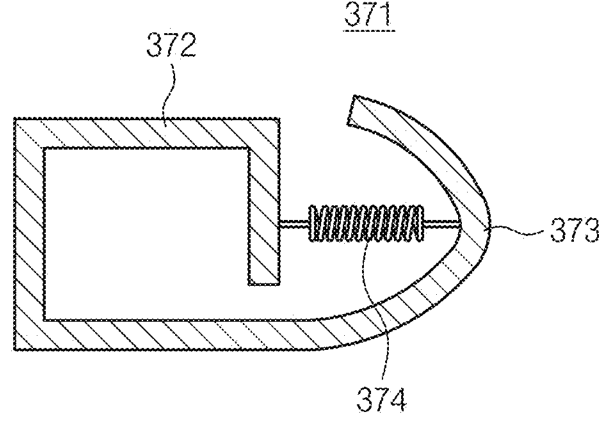
FIGS. 10 and 11 are diagrams schematically illustrating another exemplary embodiment of the connecting unit of FIG. 2.
Figure 11:
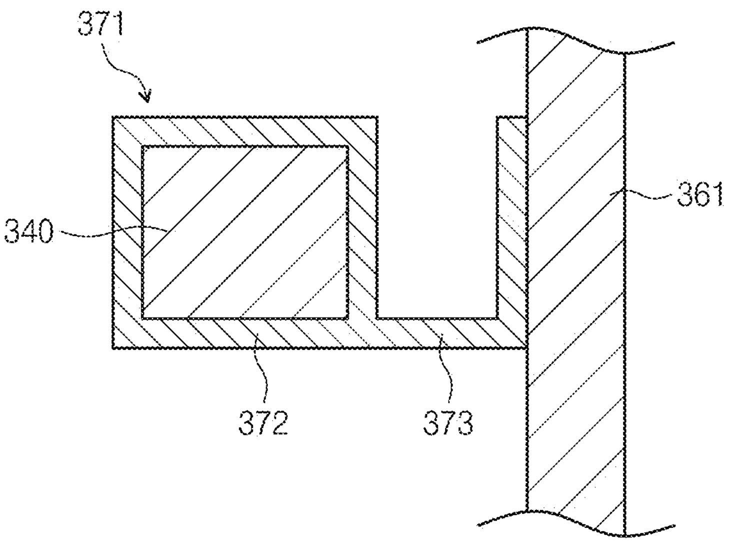

FIGS. 10 and 11 are diagrams schematically illustrating another exemplary embodiment of the connecting unit of FIG. 2. Referring to FIG. 10, the connecting unit 370 may include a first connecting member 371 and a second connecting member 375. As noted above, the second connecting member 375 is provided with a structure that is generally similar to the first connecting member 371, and therefore the following description will focus on the first connecting member 371.

The first connecting member 371 may further include an elastic member 374. The elastic member 374 may be provided from a material having large elastic force. For example, the elastic member 374 may be provided as a spring. The elastic member 374 may be disposed between the first connecting unit 372 and the second connecting unit 373. In one example, as shown in FIG. 9, one end of the elastic member 374 may be coupled to one point on the second connecting unit 373 where the second connecting unit 373 and the first shield member 361 are in point contact. The other end of the elastic member 374 may be coupled to one point on the first connecting unit 372 that is opposite the one point on the second connecting unit 373. The elastic member 374 is provided between the first connecting unit 372 and the second connecting unit 373 to efficiently connect the antenna 340 and the shield unit 360. Furthermore, the elastic member 374 enables the connecting unit 370 to slide easily along the longitudinal direction of the antenna 340.

Referring to FIG. 11, the second connecting unit 373 extends from the first connecting unit 372. The second connecting unit 373 may have a generally "L" shape. A vertically extending portion of the second connecting unit 373 may be in face contact with the shield unit 360. Optionally, the second connecting unit 373 may extend from the first connecting unit 372, but may be formed to have a generally "¬" shape. By providing the first connecting unit 372 of the connecting unit 370 to be in contact with the coating provided on the antenna 340 and the second connecting unit 373 to be in contact with the shield unit 360, voltage may be applied from the antenna 340 to the shield unit 360 more efficiently.

Figure 12:
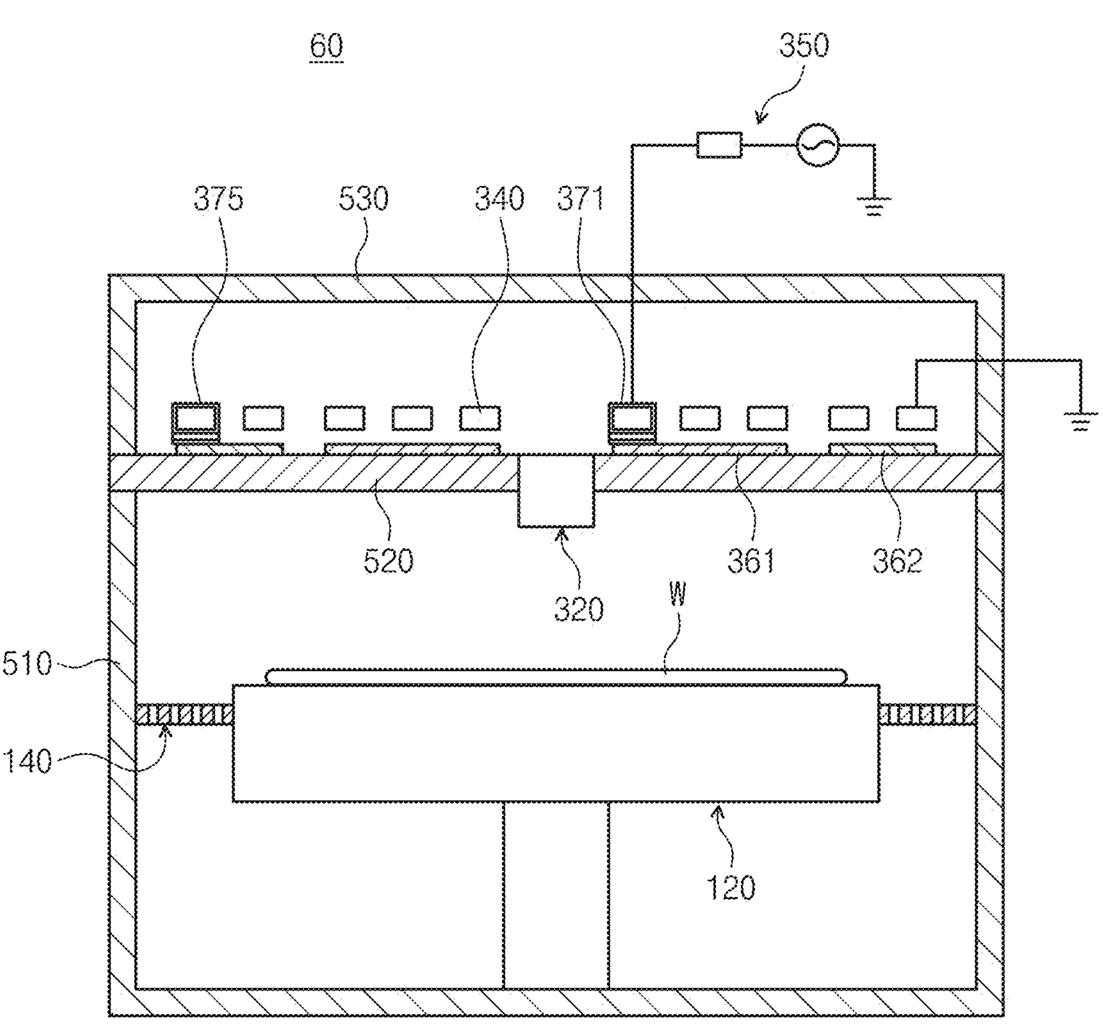
FIG. 12 is a diagram schematically illustrating another exemplary embodiment of the process chamber of FIG. 1.
Figure 13:
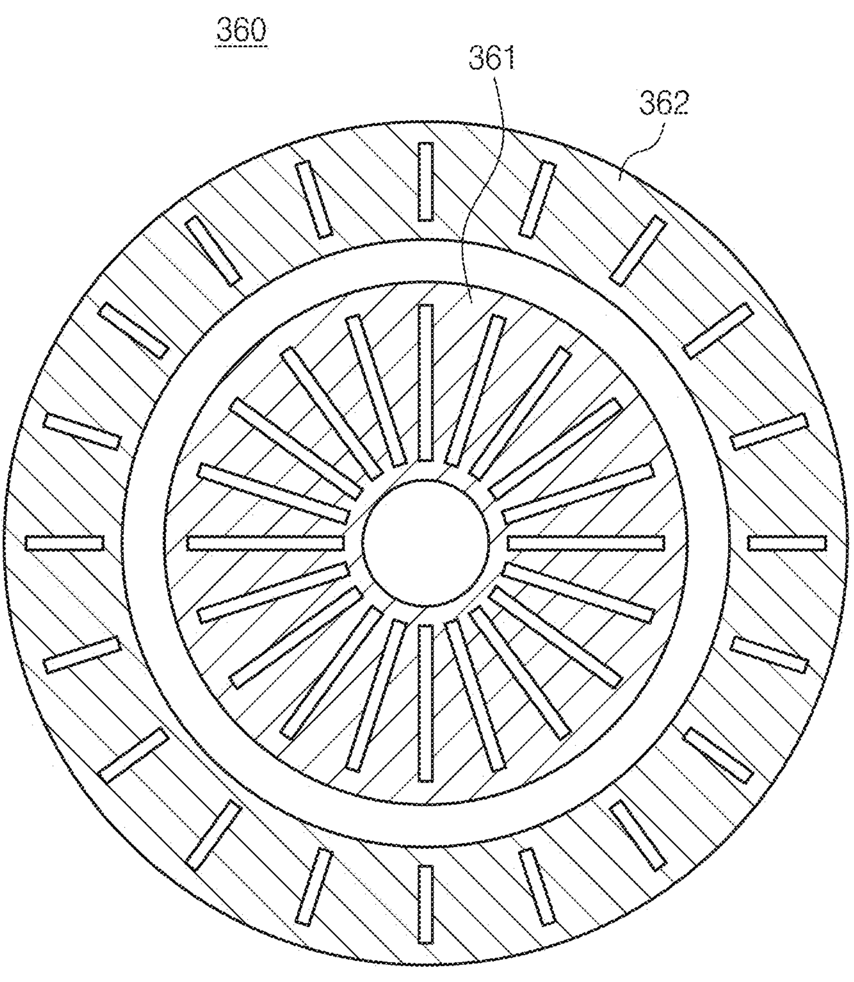
FIG. 13 is a diagram schematically illustrating the shield unit of FIG. 12 viewed from above.

FIG. 12 is a diagram schematically illustrating another exemplary embodiment of the process chamber of FIG. 1. FIG. 13 is a diagram schematically illustrating the shield unit of FIG. 12 viewed from above. Referring to FIGS. 12 and 13, the process chamber 60 may include a housing 500, a window unit 520, a gas supply unit 320, and a plasma generation unit 330.

The housing 500 may have a lower space and an upper space where the substrate W is processed. The housing 500 may include a lower body 510 and an upper body 530. The lower body 510 may have a space with an open top surface therein. The lower body 510 may have a lower space in which the substrate W is processed in combination with the window unit 520 described later. In the lower space, the support unit 120 and the exhaust baffle 140 may be located. The configurations of the support unit 120 and the exhaust baffle 140 according to the exemplary embodiment of the present invention are provided similarly to the configurations of the support unit 120 and the exhaust baffle 140 described in FIG. 2, so a description thereof will be omitted.

The upper body 530 may have a bottom side open space on its interior. The upper body 530 may have an upper space in which the plasma generation unit 330 is disposed therein in combination with the window unit 520.

The window unit 520 may include a dielectric window. The window unit 520 may cover an open top surface of the lower body 510. An opening may be formed in the window unit 520. A gas supply unit 320 may be disposed in the opening formed in the window unit 520. The gas supply unit 320 may be provided substantially similar to the configuration of the gas supply unit 320 described with reference to FIG. 2.

The plasma generation unit 330 may be located in the upper space. The antenna 340 may be provided as a planar antenna in the upper space. The antenna 340 may be formed in a helical shape. Since the antenna 340 according to the exemplary embodiment of the present invention is provided similarly to the antenna 340 described in FIG. 2 except that the antenna 340 is provided as a planar antenna, a description thereof will be omitted.

The shield unit 360 may be located in the upper space. The shield unit 360 may be disposed between the antenna 340 and the window unit 520. The shield units 360 may be provided in a plurality. For example, as shown in FIG. 13, the shield unit 360 may include a first shield member 361 and a second shield member 362. The first shield member 361 may be formed in a region corresponding to a region including the center of the window unit 520 when viewed from above. The second shield member 362 may be formed in a region surrounding an outer side of the first shield member 361.

The first shield member 361 and the second shield member 362 may be electrically isolated from each other. Additionally, the first shield member 361 and the second shield member 362 may be electrically connected with the first connecting member 371 and the second connecting member 375, respectively. The mechanism for applying voltage to the first shield member 361 and the second shield member 362 by the first connecting member 371 and the second connecting member 375 is similar to that described above. Accordingly, a detailed description thereof will be omitted to avoid duplication of content.

Figure 14:
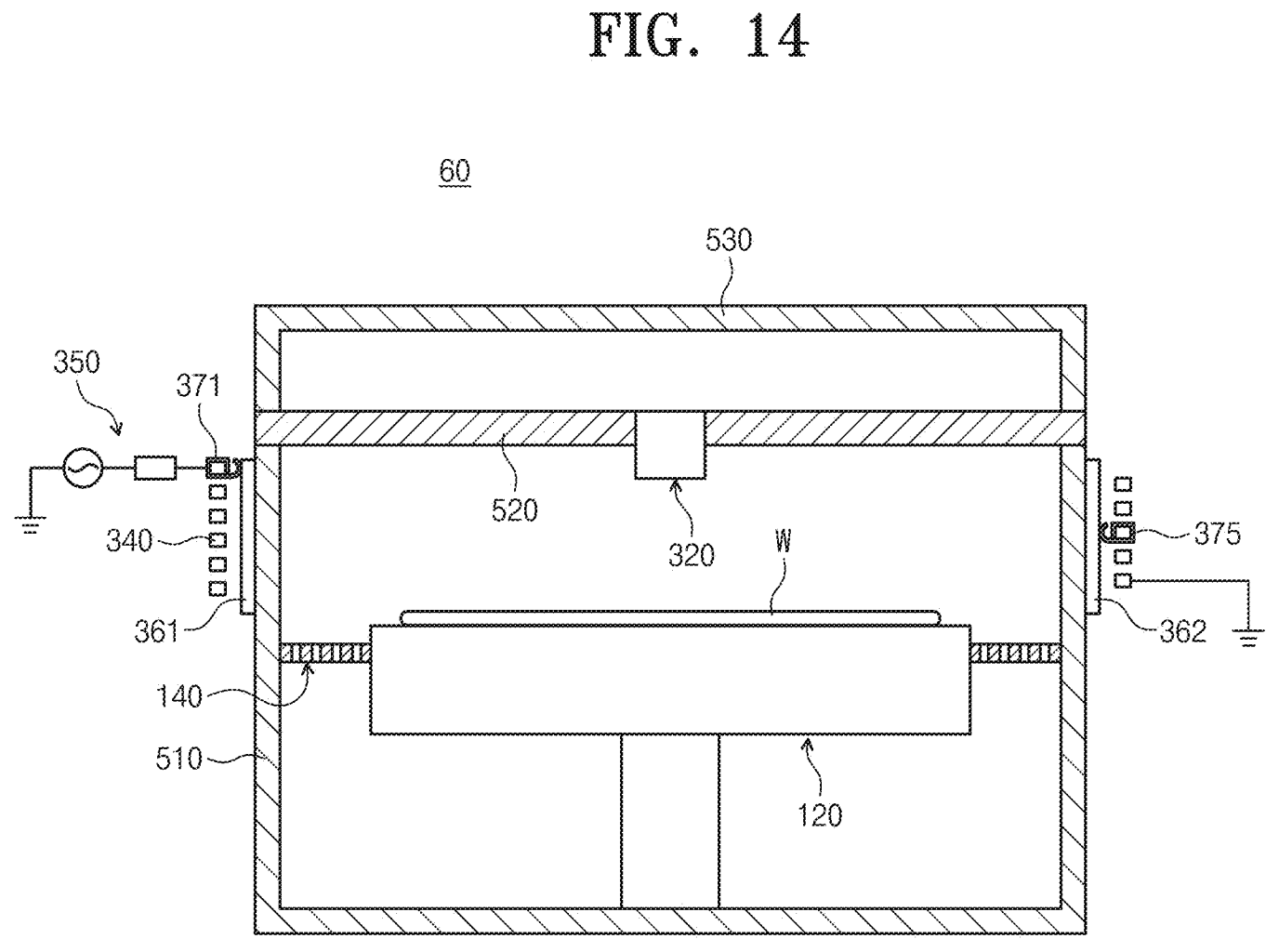

FIG. 14 is a diagram schematically illustrating another exemplary embodiment of the process chamber of FIG. 13. Referring to FIG. 14, the shield unit 360 may be formed to surround one sidewall of the lower body 510. For example, the shield unit 360 may surround one sidewall of the lower body 510 corresponding to a top region of the lower body 510. The upper region of the lower body 510 may refer to a region between the substrate W supported on the support unit 120 and the window unit 520. Further, the antenna 340 may be formed to surround an outer surface of the shield unit 360 that surrounds a sidewall of the lower body 510.

The foregoing detailed description illustrates the present invention. Further, the above content illustrates and describes the exemplary embodiment of the present invention, and the present invention may be used in various other combinations, modifications, and environments. That is, the foregoing content may be modified or corrected within the scope of the concept of the invention disclosed in the present specification, the scope equivalent to that of the invention, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

The invention claimed is:

1. An apparatus for treating a substrate, the apparatus comprising:

a process treatment unit for providing a treatment space in which the substrate is treated; and a plasma generation unit provided above the process treatment unit to generate plasma from process gas, wherein the plasma generation unit includes:

a plasma chamber having a discharge space formed therein;

a shield unit surrounding an exterior of the plasma chamber;

an antenna which surrounds the shield unit from an outside of the shield unit and to which high frequency power is applied; and a connecting unit for electrically connecting the shield unit to the antenna such that high frequency voltage from the antenna is applied to the shield unit to improve initial discharge efficiency, and wherein the connecting unit is movably provided along a longitudinal direction of the antenna.

2. The apparatus of claim 1, wherein the shield unit includes:

a first shield member surrounding one side of the plasma chamber along a circumference direction of the plasma chamber; and a second shield member facing the first shield member and surrounding an other side opposite the one side of the plasma chamber, and the first shield member and the second shield member are combined with each other to surround an outer surface of the plasma chamber.

3. The apparatus of claim 2, wherein the first shield member and the second shield member are electrically isolated from each other.

4. The apparatus of claim 1, wherein the connecting unit includes:

a first connecting unit that is in contact with the antenna; and a second connecting unit that extends from the first connecting unit in a direction toward the shield unit and is in contact with the shield unit.

5. The apparatus of claim 4, wherein the first connecting unit is formed to surround an outer surface of the antenna and is movable to slide along the outer surface of the antenna.

6. The apparatus of claim 5, wherein the first connecting unit is in face contact with the antenna, and the second connecting unit is in point contact with the shield unit.

7. The apparatus of claim 5, wherein the first connecting unit is in face contact with the antenna, and the second connecting unit is in face contact with the shield unit.

8. The apparatus of claim 6, wherein the second connecting unit is formed to be curved in a direction toward the first connecting unit.

9. The apparatus of claim 6, wherein the second connecting unit is provided with a material having elasticity, and an elastic member is further provided between one point on the second connecting unit where the second connecting unit and the shield unit are in point contact, and another point on the first connecting unit facing the one point.

10. The apparatus of claim 1, wherein a length of the shield unit in an up and down direction corresponds to or is larger than a length of the antenna in the up and down direction.

11. An apparatus for treating a substrate, the apparatus comprising:

a process treatment unit for providing a treatment space in which the substrate is treated; and a plasma generation unit provided above the process treatment unit to generate plasma from process gas, wherein the plasma generation unit includes:

a plasma chamber having a discharge space formed therein;

a shield unit surrounding an exterior of the plasma chamber;

an antenna which surrounds the shield unit from an outside of the shield unit and to which high frequency power is applied; and a connecting unit for electrically connecting the shield unit to the antenna such that high frequency voltage from the antenna is applied to the shield unit to improve initial discharge efficiency, wherein the shield unit includes:

a first shield member surrounding one side of the plasma chamber along a circumference direction of the plasma chamber; and a second shield member facing the first shield member and surrounding an other side opposite the one side of the plasma chamber, and the first shield member and the second shield member are combined with each other to surround an outer surface of the plasma chamber, wherein the first shield member and the second shield member are electrically isolated from each other, and wherein a power terminal to which high frequency power is applied is formed at an upper end of the antenna, and a ground terminal that is grounded is formed at a lower end of the antenna, and the connecting unit includes:

a first connecting member that electrically directly connects a first point of the antenna and the first shield member; and a second connecting member that electrically directly connects a second point of the antenna and the second shield member, and a distance from the first point to the power terminal and a distance from the second point to the power terminal are provided differently.

12. The apparatus of claim 11, wherein the first point is located in an upper region of the antenna, and the second point is located in a middle region of the antenna.

13. An apparatus for treating a substrate, the apparatus comprising:

a chamber for providing a plasma generation region;

an antenna disposed adjacent to the chamber, and including a power terminal to which high frequency power is applied and a ground terminal that is grounded;

a shield unit disposed between the chamber and the antenna; and a connecting unit for electrically connecting the shield unit to the antenna such that high frequency voltage from the antenna is applied to the shield unit to improve initial discharge efficiency, wherein the connecting unit is movably provided along a longitudinal direction of the antenna.

14. The apparatus of claim 13, wherein the antenna is disposed to surround an exterior of the chamber, and the shield unit includes a first shield member and a second shield member that are disposed to be spaced apart in a direction of surrounding the chamber, and the first shield member and the second shield member are electrically isolated from each other.

15. The apparatus of claim 14, wherein the connecting unit includes:

a first connecting member for connecting the first shield member to a first point of the antenna; and a second connecting member for connecting the second shield member to a second point of the antenna, and the first point and the second point are at different distances from the power terminal.

16. The apparatus of claim 13, wherein the connecting unit includes:

a first connecting unit that is in contact with the antenna; and a second connecting unit that extends from the first connecting unit in a direction toward the shield unit and is in contact with the shield unit.

17. The apparatus of claim 16, wherein the first connecting unit is formed to surround an outer surface of the antenna to be in face contact with the antenna, and is movable to slide along the outer surface of the antenna, and the second connecting unit is formed to be curved in a direction toward the first connecting unit to be in point contact with the shield unit.

18. The apparatus of claim 17, wherein the second connecting unit is provided with a material having elasticity, and an elastic member is further provided between one point on the second connecting unit where the second connecting unit and the shield unit are in point contact, and another point on the first connecting unit facing the one point.

* * * * *